(12) United States Patent
Cho et al.

(10) Patent No.: US 8,506,703 B2
(45) Date of Patent: Aug. 13, 2013

(54) METHOD AND APPARATUS FOR FORMING COLLOIDAL PHOTONIC CRYSTALS

(75) Inventors: Young-sang Cho, Seoul (KR); Mi-jeong Song, Suwon-si (KR); Hong-seok Lee, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 821 days.

(21) Appl. No.: 12/359,687

(22) Filed: Jan. 26, 2009

(65) Prior Publication Data

US 2009/0291228 A1 Nov. 26, 2009

(30) Foreign Application Priority Data

May 20, 2008 (KR) .................. 10-2008-0046593

(51) Int. Cl.
*C30B 1/00* (2006.01)
*C30B 3/00* (2006.01)
*C30B 5/00* (2006.01)
*C30B 28/02* (2006.01)

(52) U.S. Cl.
USPC .................................... 117/5; 117/4

(58) Field of Classification Search
USPC ................................... 117/5, 4
See application file for complete search history.

(56) References Cited

U.S. PATENT DOCUMENTS

| | | | |
|---|---|---|---|
| 6,797,057 B1 * | 9/2004 | Amos et al. ............. | 117/68 |
| 6,961,175 B2 * | 11/2005 | Toda et al. ............. | 359/452 |
| 7,035,008 B2 * | 4/2006 | Toda et al. ............. | 359/452 |
| 2004/0131799 A1 * | 7/2004 | Arsenault et al. ....... | 428/1.26 |

\* cited by examiner

*Primary Examiner* — James McDonough
(74) *Attorney, Agent, or Firm* — Cantor Colburn LLP

(57) ABSTRACT

A method for forming colloidal photonic crystals comprises; surrounding an outer circumference of a cylinder with a flexible substrate, spacing the cylinder a predetermined distance from a panel coated with a colloidal solution, and rotating the cylinder to form colloidal photonic crystals on the flexible panel.

9 Claims, 3 Drawing Sheets

METHOD AND APPARATUS FOR FORMING COLLOIDAL PHOTONIC CRYSTALS

This application claims priority to Korean Patent Application No. 10-2008-0046593, filed on May 20, 2008, and all the benefits accruing therefrom under 35 U.S.C. §119, the contents of which in its entirety are herein incorporated by reference.

BACKGROUND OF THE INVENTION

1. Field of the Invention

The present invention relates to a method and apparatus for forming colloidal photonic crystals, and more particularly, to a method and apparatus for forming colloidal photonic crystals on a flexible substrate.

2. Description of the Related Art

Photonic crystals have periodic structures in which various materials having sizes of several hundred nanometers to several micrometers are arranged in one, two, or three dimensions. Photonic crystals can be manufactured using a photolithography technique, a micro-electro mechanical system ("MEMS") technique, or a colloidal self-assembly technique.

Photonic crystals reflect visible light having a predetermined wavelength among the various wavelengths of white light, and are applied in various fields. In detail, the colloidal photonic crystals can be applied to various systems that require an optical filter. For example, colloidal photonic crystals reflecting visible light corresponding to red, green, or blue wavelengths among the various wavelengths of white light can be used as color filters of a reflective display device. In addition to this optical application, since colloidal photonic crystals have a structure in which monodisperse colloidal particles are regularly self-assembled, when surfaces of the colloidal particles that form colloidal photonic crystals are doped with a catalyst material, the colloidal particles can be used as catalyst supports. Also, since the wavelength of light reflected by the colloidal photonic crystals changes according to the angle of incidence of white light on the colloidal photonic crystals, the color changes according to angles from which the observer is looking. Accordingly, the colloidal photonic crystals can also be used in cosmetic products, e.g., for nails or faces.

In the conventional art, colloidal photonic crystals are manufactured by coating a colloidal solution, in which colloidal particles are dispersed, on a flat substrate, and then evaporating a solvent to self-assemble the colloidal particles voluntarily, or by using a dip coating method in which the substrate is dipped in the colloidal solution and then removed very slowly to evaporate the solvent, thereby forming photonic crystals. However, these methods require long times for evaporation of the solvent, and it is difficult to produce photonic crystals on large surfaces using these methods. In a known method for solving these above problem, a high-density colloidal solution, in which colloidal particles are condensed, is injected between two flat substrates spaced apart from each other. Then, a shear stress is applied to the colloidal solution using relative vibration of the two flat substrates, thereby self-assembling colloidal particles. However, this method requires a spacer to maintain a predetermined distance between the two flat substrates between which the colloidal solution is injected. In addition, some of the photonic crystals may be damaged when removing the flat substrates after the colloidal photonic crystals are formed.

BRIEF SUMMARY OF THE INVENTION

The present invention provides a method of forming colloidal photonic crystals on a flexible substrate.

According to an exemplary embodiment of the present invention, a method of forming colloidal photonic crystals comprises; surrounding an outer circumference of a cylinder with a flexible substrate, spacing the cylinder a predetermined distance from a panel coated with a colloidal solution, and rotating the cylinder to form colloidal photonic crystals on the flexible panel.

In one exemplary embodiment, the photonic crystals may be formed by applying shear stress to a plurality of colloidal particles in the colloidal solution between the flexible substrate and the flat panel, wherein the shear stress is formed by the rotation of the cylinder.

In one exemplary embodiment, the thickness of the colloidal photonic crystals formed on the flexible substrate may be adjusted by controlling at least one of a distance between the cylinder and the flat panel, a rotation speed of the cylinder, and a total rotation time of the cylinder.

In one exemplary embodiment, the colloidal photonic crystals may have one of face-centered cubic structures and hexagonal closed packed structures.

In one exemplary embodiment, the flexible substrate may be surface-treated such that the colloidal solution is easily attached to the flexible substrate. Exemplary embodiments of the surface treatment of the flexible substrate may include at least one of corona discharge treatment and oxygen plasma treatment.

In one exemplary embodiment, a plurality of colloidal particles dispersed in the colloidal solution may be formed of one of a ceramic material and a polymer latex.

In one exemplary embodiment, the method may further comprise performing a fixing process on the colloidal photonic crystals after forming of the colloidal photonic crystals on the flexible substrate. In one exemplary embodiment, the colloidal photonic crystals may be fixed by an ultraviolet light ("UV") treatment. In one exemplary embodiment, a solvent in the colloidal solution may include a UV hardening monomer, e.g., a monomer that hardens when exposed to ultraviolet light.

According to another exemplary embodiment of the present invention, an apparatus for forming colloidal photonic crystals comprises; a cylinder, a flexible substrate surrounding an outer circumference of the cylinder, and a panel disposed a predetermined distance from the round cylinder, and coated with a colloidal solution, wherein colloidal photonic crystals are formed on the flexible substrate by rotating the cylinder.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
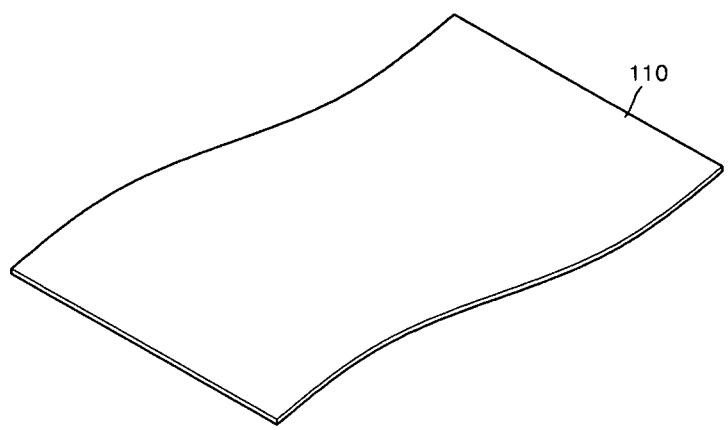
FIG. 1 is a front perspective view of an exemplary embodiment of a flexible substrate according to the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals in the drawings denote like elements. In the drawings, the thicknesses of layers and regions are exaggerated for clarity.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
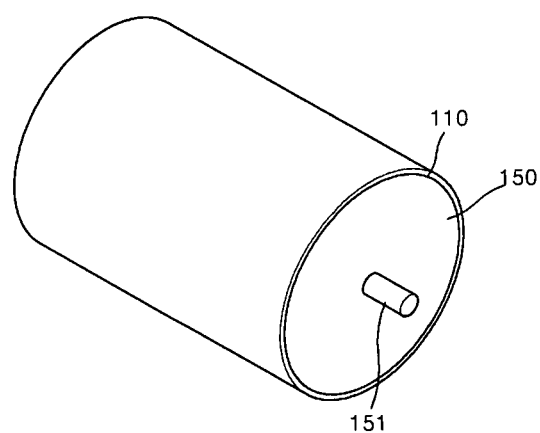
FIG. 2 is a front perspective view of an exemplary embodiment of the flexible substrate of FIG. 1 wrapped around an exemplary embodiment of a round cylinder according to the present invention.
Figure 3:
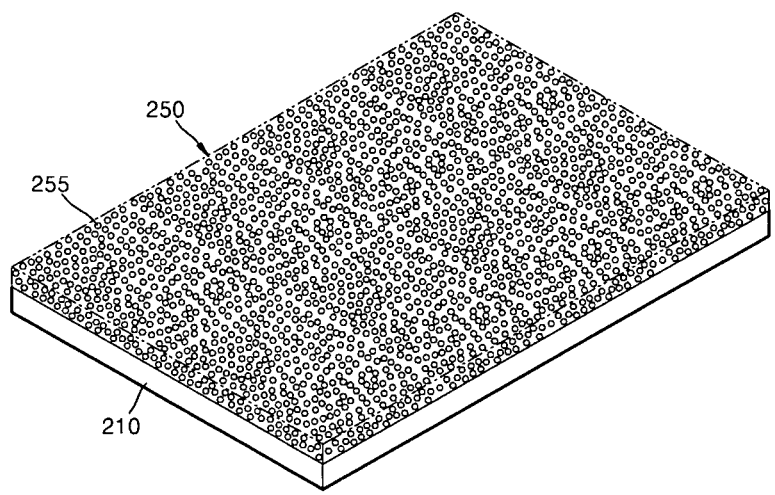
FIG. 3 is a front perspective view of an exemplary embodiment of a flat panel including a colloidal solution having a plurality of colloidal particles according to the present invention.
Figure 4:
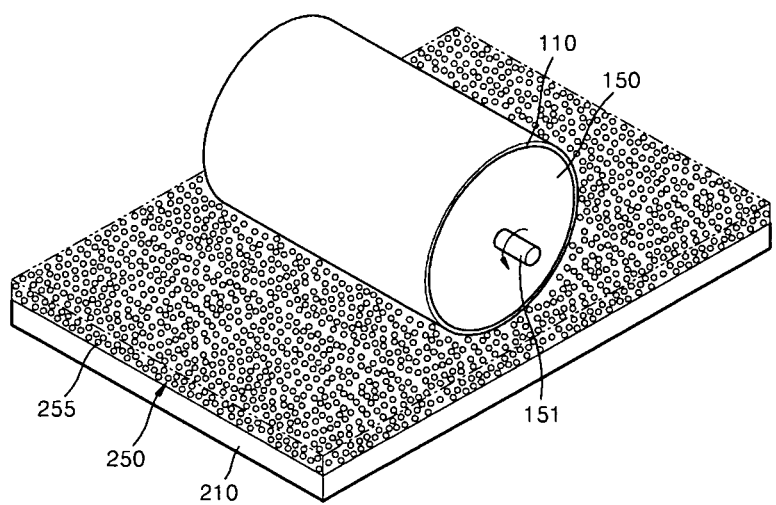
FIG. 4 is a front perspective view of the exemplary embodiment of a flexible substrate wrapped around an exemplary embodiment of a round cylinder of FIG. 2 disposed on the flat panel of FIG. 3.
Figure 5:
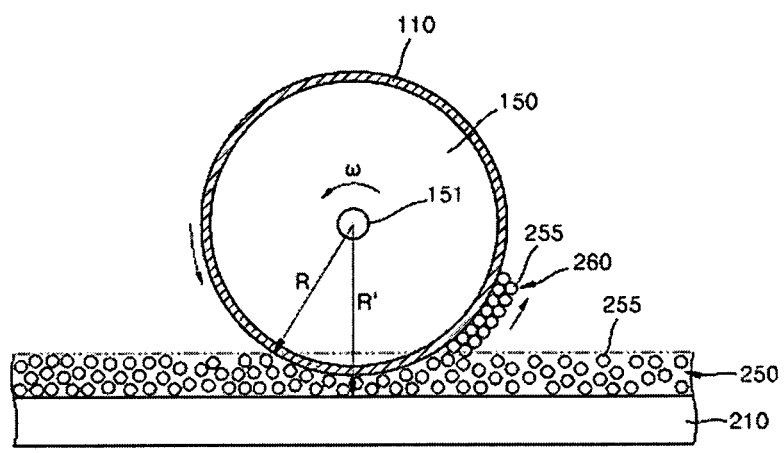
FIG. 5 is a side perspective view of the exemplary embodiment of a flexible substrate wrapped around an exemplary embodiment of a round cylinder of FIG. 2 disposed on the flat panel of FIG. 3.
Figure 6:
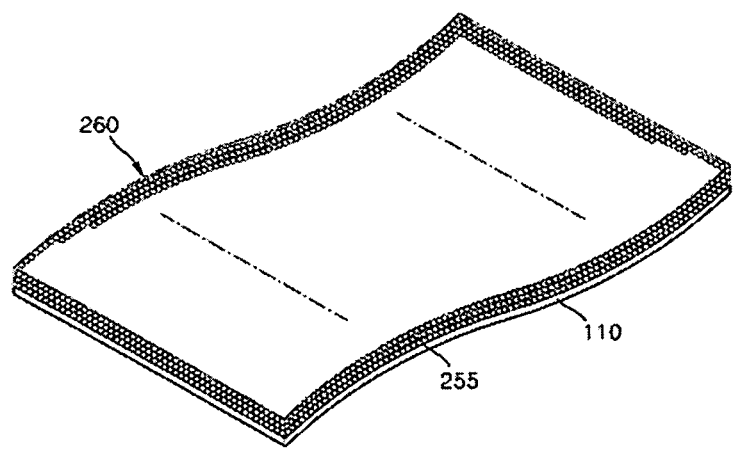
FIG. 6 is a front perspective view of an exemplary embodiment of a flexible substrate including colloidal photonic crystals according to the present invention.

FIGS. 1 through 6 are schematic views illustrating an exemplary embodiment of a method of forming photonic crystals according to the present invention. FIG. 1 is a front perspective view of an exemplary embodiment of a flexible substrate according to the present invention. FIG. 2 is a front perspective view of an exemplary embodiment of the flexible substrate of FIG. 1 wrapped around an exemplary embodiment of a round cylinder according to the present invention. FIG. 3 is a front perspective view of an exemplary embodiment of a flat panel including a colloidal solution having a plurality of colloidal particles according to the present invention. FIG. 4 is a front perspective view of the exemplary embodiment of a flexible substrate wrapped around an exemplary embodiment of a round cylinder of FIG. 2 disposed on the flat panel of FIG. 3. FIG. 5 is a side perspective view of the exemplary embodiment of a flexible substrate wrapped around an exemplary embodiment of a round cylinder of FIG. 2 disposed on the flat panel of FIG. 3 and FIG. 6 is a front perspective view of an exemplary embodiment of a flexible substrate including colloidal photonic crystals according to the present invention.

First, referring to FIG. 1, a flexible substrate 110 is provided. Exemplary embodiments of the flexible substrate 110 may include a plastic film or other materials having similar characteristics, but the invention is not limited thereto. The flexible substrate 110 may be surface-treated so that a colloidal solution (250 of FIG. 5) can be easily attached on the flexible substrate 110 in a process to be described in more detail below. In one exemplary embodiment, when the colloidal solution 250 contains a hydrophilic solvent, a surface of the flexible substrate 110 may be treated to be hydrophilic, exemplary embodiments of the treatment may include corona discharge treatment or oxygen plasma treat or other similar processes. In alternative exemplary embodiments, when the colloidal solution 250 contains a hydrophobic solvent, the surface of the flexible substrate 110 may be treated to be hydrophobic.

Referring to FIG. 2, a round cylinder 150 having a predetermined diameter is provided. In one exemplary embodiment, the round cylinder 150 may have an outer circumference having a size corresponding to the length of the flexible substrate 110. A shaft 151 is provided in a center of the round cylinder 150, around which the round cylinder 150 rotates. The outer circumference of the round cylinder 150 is surrounded by the flexible substrate 110 as illustrated in FIG. 2.

Referring to FIG. 3, a flat panel 210 that is coated with a predetermined thickness of colloidal solution 250 is provided. Exemplary embodiments of the flat panel 210 may include a glass substrate or a substrate made from other materials having similar characteristics, but the present invention is not limited thereto.

The colloidal solution 250 is a solution in which a plurality of colloidal particles 255 is dispersed in a predetermined solvent. In the current exemplary embodiment, a colloidal solution 250 having a relatively high density in which the colloidal particles 255 are condensed may be used. Exemplary embodiments include configurations wherein the colloidal particles 255 may be formed of a ceramic material, or a polymer latex, or other materials having similar characteristics. Exemplary embodiments of the ceramic materials may include silica, titania, zirconia, and alumina, combinations thereof, and other materials having similar characteristics, and exemplary embodiments of the polymer latex include polystyrene ("PS"), polymethylmethacrylate ("PMMA"), and other materials having similar characteristics. However, the above-listed materials are only exemplary embodiments, and the colloidal particles 255 may be formed of other various materials than the above-described colloidal particles 255.

Exemplary embodiments include configurations wherein the solvent in the colloidal solution 250 may be hydrophilic or hydrophobic depending on the property of the surface of the above-described flexible substrate 110. Exemplary embodiments of the solvent include a UV hardening monomer. A solvent formed of the UV hardening monomer may fix colloidal photonic crystals 260 on the flexible substrate 110 during a process of forming colloidal photonic crystals 260, as will be described below with reference to FIGS. 4 and 5.

Next, referring to FIGS. 4 and 5, the cylinder 150, surrounded by the flexible substrate 110, is positioned a predetermined distance apart from the flat panel 210, which is doped with the colloidal solution 250. In one exemplary embodiment, the cylinder 150 may be disposed such that a distance between the cylinder 150 and the flat panel 210 is smaller than the thickness of the colloidal solution 250 doped on the flat panel 210. As described above, while the cylinder 150 is positioned as illustrated in FIG. 4, the cylinder 150 is rotated at a predetermined angular speed around the shaft 151. FIG. 5 is a cross-sectional view illustrating the cylinder 150 surrounded by the flexible substrate 110 on an upper portion of the flat panel 210 doped with the colloidal solution 250, while the cylinder is being rotated. In FIG. 5, $\Omega$ denotes a rotational angular speed, R' denotes a distance between a center of the cylinder 150 and the flat panel 210, and R denotes the sum of the radius of the cylinder 150 and the thickness of the flexible substrate 110.

When the cylinder 150, surrounded by the flexible substrate 110, is disposed on the upper portion of the flat panel 210, which is doped with the colloidal solution 250, and is rotated, shear stress is applied to the colloidal solution 250 between the cylinder 150 and the flat panel 210 due to the rotation of the cylinder 150. As the shear stress is applied to the colloidal solution 250, the colloidal particles 255 in the colloidal solution 250 are regularly arranged in predetermined forms on the flexible substrate 110.

The regularly arranged colloidal particles 255 disposed in the colloidal solution 250 become adhered to the flexible substrate 110 surrounding the outer circumference of the cylinder 150. As described above, if the surface of the flexible substrate 110 is treated to be hydrophilic or hydrophobic according to the characteristic of the solvent in the colloidal solution 250, the colloidal solution 250 can be adhered on the flexible substrate 110 in a more efficient way. Accordingly, colloidal photonic crystals 260 in which the colloidal particles 255 are regularly arranged in predetermined forms may be formed on the flexible substrate 110 to a predetermined thickness. In one exemplary embodiment, the colloidal photonic crystals 260 may be formed to have face-centered cubic structures, or hexagonal closed packed structures, or other structures as desired. The thickness of the colloidal photonic crystals 260 formed on the flexible substrate 110 may be adjusted by varying at least one of a plurality of parameters such as a distance between the cylinder 150 and the flat panel 210 (that is, the distance R' minus the distance R as shown in FIG. 5), a rotational angular speed $\omega$ of the cylinder 150, and a total rotation time of the cylinder 150, e.g., the total time the cylinder 150 is allowed to rotate at the angular speed $\omega$.

Finally, referring to FIG. 6, the flexible substrate 110 on which the colloidal photonic crystals 260 are formed is removed from the surface of the cylinder 150. Alternative exemplary embodiments include configurations wherein after the colloidal photonic crystals 260 are initially formed on the flexible substrate 110, further fixing processes may be employed on the colloidal photonic crystals 260. In one exemplary embodiment when the solvent in the colloidal solution 250 contains a UV hardening monomer, and the colloidal photonic crystals 260 formed on the flexible substrate 110 are UV-treated, the solvent between the colloidal particles 255 becomes hardened, and thus the colloidal photonic crystals 260 can be fixed on the flexible substrate 110.

In addition, in one exemplary embodiment minute patterns (not shown) having predetermined shapes, exemplary embodiments of which include steps or figures, may be formed on the flat panel 210, and thereafter shapes corresponding to these shapes may be formed on the colloidal photonic crystals 260.

As described above, according to the present embodiment, the colloidal photonic crystals 260 are formed on the flexible substrate 110 by applying shear stress to the colloidal solution 250 between the cylinder 150 and the flat panel 210 by rotating the cylinder 150 that is surrounded by the flexible substrate 110, and thus the colloidal crystals 260 can be formed on the flexible substrate 110 using a relatively simple apparatus and process. Also, a large-surface area of colloidal photonic crystals can be easily formed on the flexible substrate 110, e.g., substantially equal to the width and circumference of the cylinder 150.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming colloidal photonic crystals, the method comprising:

surrounding an outer circumference of a cylinder with a flexible substrate;

spacing the cylinder a predetermined distance from a flat panel coated with a colloidal solution; and rotating the cylinder to form colloidal photonic crystals on the flexible substrate, wherein the flexible substrate is surface-treated such that the colloidal solution is easily attached to the flexible substrate.

2. The method of claim 1, wherein the photonic crystals are formed by applying shear stress to a plurality of colloidal particles in the colloidal solution between the flexible substrate and the panel, wherein the shear stress is formed by the rotation of the cylinder.

3. The method of claim 1, wherein the thickness of the colloidal photonic crystals formed on the flexible substrate is adjusted by controlling at least one of a distance between the cylinder and the panel, a rotation speed of the cylinder, and a total rotation time of the cylinder.

4. The method of claim 1, wherein the colloidal photonic crystals have one of face-centered cubic structures and hexagonal closed packed structures.

5. The method of claim 1, wherein the surface treatment of the flexible substrate comprises at least one of corona discharge treatment and oxygen plasma treatment.

6. The method of claim 1, wherein a plurality of colloidal particles dispersed in the colloidal solution is formed of one of a ceramic material and a polymer latex.

7. The method of claim 1, further comprising performing a fixing process on the colloidal photonic crystals after the forming of the colloidal photonic crystals on the flexible substrate.

8. The method of claim 7, wherein the colloidal photonic crystals are fixed by an ultraviolet light treatment.

9. The method of claim 8, wherein a solvent in the colloidal solution comprises a monomer which hardens when exposed to ultraviolet light.

* * * * *